United States Patent
Sato et al.

(10) Patent No.: US 12,119,756 B2
(45) Date of Patent: Oct. 15, 2024

(54) POWER CONVERSION DEVICE

(71) Applicant: Hitachi Industrial Equipment Systems Co., Ltd., Tokyo (JP)

(72) Inventors: Fumihiro Sato, Tokyo (JP); Keisuke Tanabe, Tokyo (JP); Koji Hamano, Tokyo (JP); Kiyotaka Tomiyama, Tokyo (JP); Hiroyoshi Miyazaki, Tokyo (JP)

(73) Assignee: Hitachi Industrial Equipment Systems Co., Ltd., Tokyo (JP)

( * ) Notice: Subject to any disclaimer, the term of this patent is extended or adjusted under 35 U.S.C. 154(b) by 212 days.

(21) Appl. No.: 17/913,451

(22) PCT Filed: Apr. 20, 2020

(86) PCT No.: PCT/JP2020/017118
§ 371 (c)(1),
(2) Date: Sep. 22, 2022

(87) PCT Pub. No.: WO2021/214846
PCT Pub. Date: Oct. 28, 2021

(65) Prior Publication Data
US 2023/0139257 A1    May 4, 2023

(51) Int. Cl.
*H02M 7/00* (2006.01)
*H02M 5/458* (2006.01)
(Continued)

(52) U.S. Cl.
CPC ........... *H02M 7/003* (2013.01); *H02M 5/458* (2013.01); *H05K 1/0213* (2013.01); *H05K 1/141* (2013.01); *H05K 2201/044* (2013.01)

(58) Field of Classification Search
CPC .... H02M 1/007; H02M 1/0006; H02M 3/003; H02M 3/33507; H02M 7/003;
(Continued)

(56) References Cited

U.S. PATENT DOCUMENTS 7,826,231 B2 * 11/2010 Yamabuchi .......... H05K 7/1432
361/784
9,985,552 B2 * 5/2018 Ikarashi ................ H05K 7/209
(Continued)

FOREIGN PATENT DOCUMENTS

EP    3 664 274 A1    6/2020
JP    10-14098 A    1/1998
(Continued)

OTHER PUBLICATIONS

Extended European Search Report issued in European Application No. 20932642.0 dated Nov. 17, 2023 (9 pages).
(Continued)

*Primary Examiner* — Tuan T Dinh
(74) *Attorney, Agent, or Firm* — Crowell & Moring LLP

(57) ABSTRACT

Provided is a power conversion device which comprises a main circuit board, a first board, and a second board and which has a reduced size. The main circuit board has a rectifier circuit and an inverter circuit which are disposed in a high-power section, the rectifier circuit rectifying AC voltage and The second board is provided with a The first board is connected to the main circuit board and to the second board, and is provided with: a first circuit disposed in a low-power section. The second board is provided with a second circuit disposed in a low-power section. section from each other in a reinforced manner; an insulating transformer disposed in the reinforced insulation region and constituting a constituent component of a power supply circuit for receiving the DC voltage and supplying power to the first circuit and to the second circuit; and an insulating element disposed in the reinforced insulation region and allowing a signal to be exchanged between the first circuit and the second circuit.

14 Claims, 18 Drawing Sheets

(51) Int. Cl.
*H05K 1/02* (2006.01)
*H05K 1/14* (2006.01)

(58) Field of Classification Search
CPC ....... H02M 7/5387; H05K 1/14; H05K 1/141; H05K 1/0213
USPC .................. 361/782–784, 790, 795
See application file for complete search history.

(56) References Cited

U.S. PATENT DOCUMENTS

| | | | |
|---|---|---|---|
| 2005/0083665 A1* | 4/2005 | Nakashima | H05K 1/181 361/767 |
| 2006/0086981 A1* | 4/2006 | Yamaguchi | H02M 7/003 257/347 |
| 2006/0120001 A1* | 6/2006 | Weber | H02M 7/003 361/103 |
| 2009/0174353 A1 | 7/2009 | Nakamura et al. | |
| 2018/0019663 A1* | 1/2018 | Fukumasu | H05K 5/04 |
| 2018/0241313 A1* | 8/2018 | Goto | H02M 3/33592 |
| 2019/0081555 A1* | 3/2019 | Li | B60L 1/00 |
| 2020/0280268 A1 | 9/2020 | Mutsuura et al. | |
| 2021/0376740 A1 | 12/2021 | Hayase | |

FOREIGN PATENT DOCUMENTS

| | | |
|---|---|---|
| JP | 2006-81312 A | 3/2006 |
| JP | 2007-300694 A | 11/2007 |
| JP | 2009-130967 A | 6/2009 |
| JP | 2019-68664 A | 4/2019 |
| WO | WO 2019/026339 A1 | 2/2019 |
| WO | WO 2019/098217 A1 | 5/2019 |

OTHER PUBLICATIONS

International Search Report (PCT/ISA/210) issued in PCT Application No. PCT/JP2020/017118 dated Jul. 14, 2020 with English translation (five (5) pages).
Japanese-language Written Opinion (PCT/ISA/237) issued in PCT Application No. PCT/JP2020/017118 dated Jul. 14, 2020 (four (4) pages).

* cited by examiner

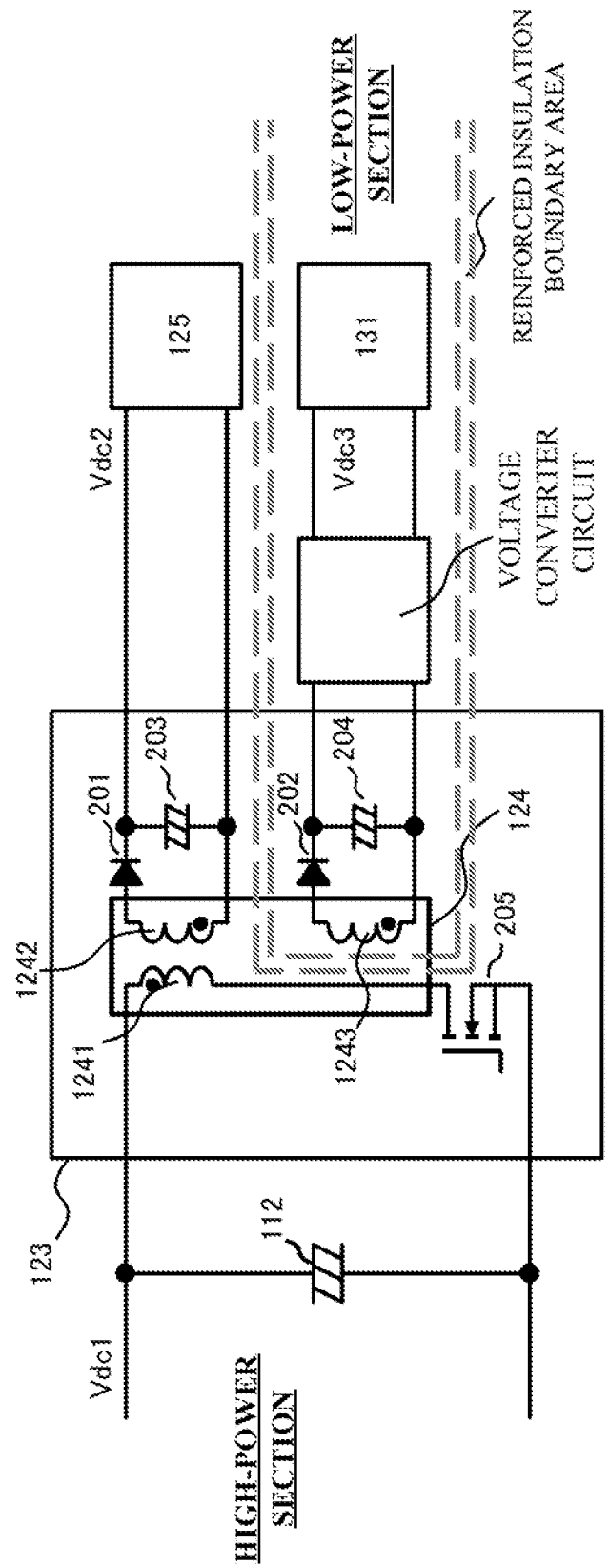

POWER CONVERSION DEVICE

BACKGROUND

Field

This invention relates to a power conversion device that supplies AC power to a motor.

Related Art

Power conversion device for motor drives receives several hundred volts of system voltage and output several hundred watts to several hundred kW of power, depending on the application. For this reason, it has a circuit section of a high-power system capable of withstanding these voltages and currents (hereinafter referred to as a high-power section). On the other hand, commands to run or stop the power conversion device are given from outside the power conversion device by the user of the conversion device by an external device such as a programmable logic controller (PLC). Therefore, the power conversion device for motor drive has a low-power circuit section (hereinafter referred to as the low-power section) as an interface between the user of the device and the high-power section, and various signals are exchanged between the high-power section and the low-power section to achieve the operation intended by the user.

Here, it is necessary for motor drive power conversion devices to take measures to ensure the safety of people involved in the operation of such devices. Various safety standards (e.g., IEC and UL standards) require, as part of electrical safety, measures to prevent electric shock between the high voltage parts, such as the system voltage and motor voltage, and the low voltage parts, which may come into contact with people. The requirements for electrical insulation, called reinforced insulation, are defined as a measure to prevent electric shock between the strong electric parts, such as system voltage and motor voltage, and the low electric parts, which may come into contact with people. In order to realize reinforced insulation, it is necessary to provide a specified insulation distance on the mounting board as defined in each standard, which causes the board area to increase. Therefore, it is effective to reduce the area of the reinforced insulation boundary as much as possible and to configure the power conversion device to save space on the board area and reduce the size of the device.

Patent document 1 describes a method of taking reinforced isolation in a power conversion device with two types of microcomputers: a current control microcomputer and a main control microcomputer. According to FIG. 1 of the Patent Document 1, the power supply circuit for control is located in the drive section, and the power supply voltage generated by the power supply circuit is supplied to the current control microcomputer and the main control microcomputer. The current control microcomputer and the main control microcomputer are reinforced and insulated with a photocoupler or other insulating element in the communication circuit.

Patent document 1: JP2007-300694A

SUMMARY

Two types of microcomputers are mounted in Patent Document 1. The current control microcomputer is located in the high-power section and the main control microcomputer is located in the low-power section, which are reinforced and insulated from each other. The power supply circuit is mounted in the drive section. Here, both the power supply line for the high-power section (current control microcomputer) and the power supply line for the low-power section (main control microcomputer) are located at the output of the power supply circuit, and the reinforced insulation boundary is located across the drive section, current control section, and multiple boards. As mentioned earlier, it is desirable to make the reinforced insulation boundary as small as possible, and the configuration in which the reinforced insulation boundary straddles the boards has the problem of causing the circuit boards to become larger.

Therefore, the purpose of the present invention is to provide a power conversion device in which the reinforced insulation boundary portion avoids a configuration in which it straddles multiple boards, thereby achieving a downsizing of the circuit board.

To solve the above problem, the power conversion device described in this invention has a main circuit board, a first board, and a second board. The main circuit board has a rectifier circuit that rectifies AC voltage and outputs DC voltage, and an inverter circuit that inversely converts DC voltage and outputs AC power in the high-power section. The second board has a second circuit arranged in the low-power section. The first board is connected to the main circuit board and the second board, and has a first circuit arranged in the high-power section, a reinforced insulation area for reinforcing insulation between the high-power section and the low-power section, and a second circuit arranged in the reinforced insulation area that receives DC voltage and outputs AC power. An isolation transformer, which is a component of a power supply circuit that supplies power to the first and second circuits, and an insulating element, which is disposed in the reinforced insulation area and causes signals to be exchanged between the first and second circuits.

According to the present invention, it is possible to avoid a configuration in which the reinforced insulation boundary straddles multiple boards and to achieve a smaller circuit board.

BRIEF DESCRIPTION OF DRAWINGS

FIG. 18 shows a circuit diagram of a flyback converter used in a power circuit.

DETAILED DESCRIPTION

The following is a detailed description of examples of the invention with reference to the drawings.

Figure 17:
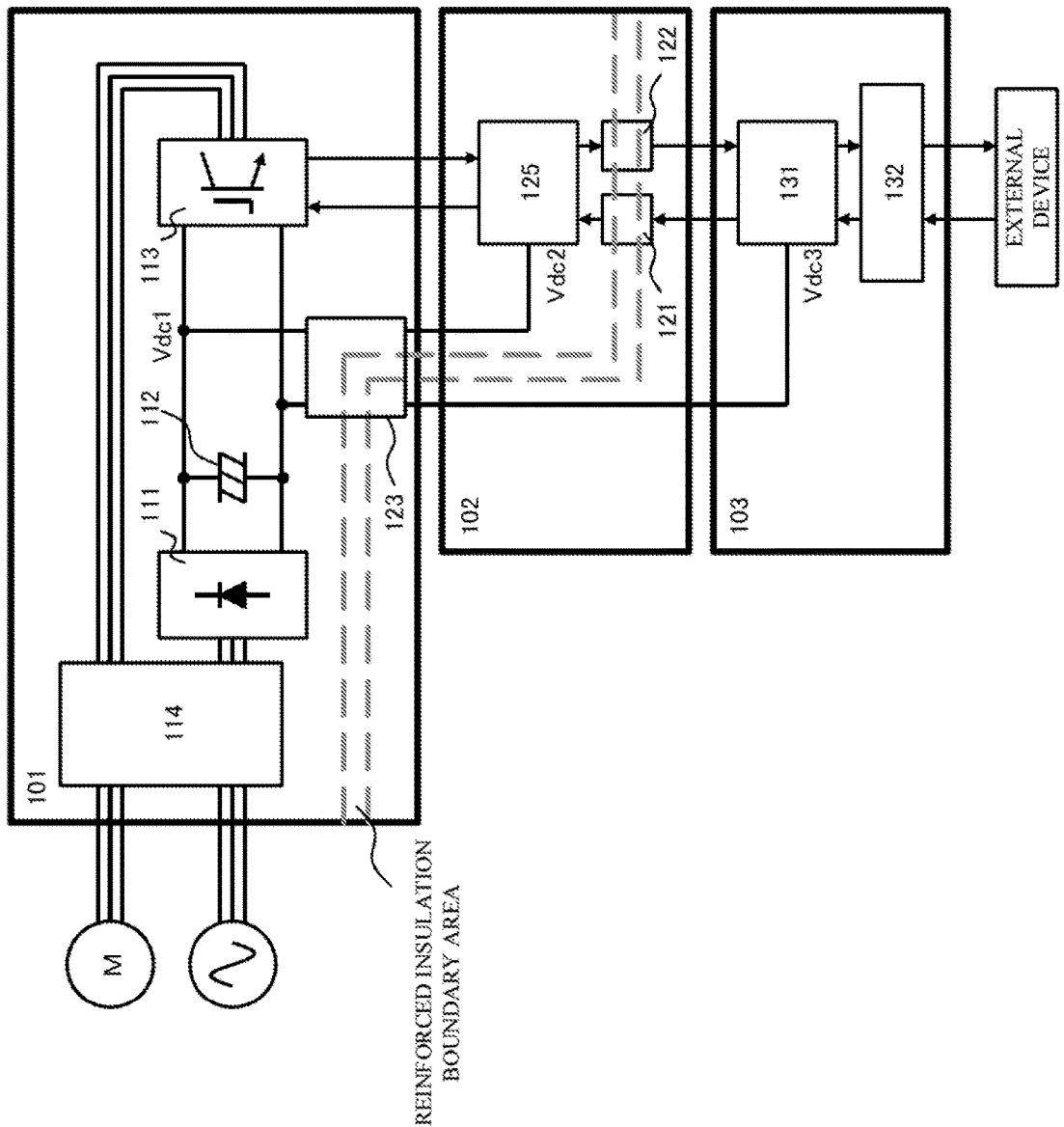
FIG. 17 is a block diagram of a conventional power conversion device.

FIG. 17 is a block diagram of the power conversion device described in the patent document. As shown in FIG. 17, a conventional power conversion device comprises of three pieces: a main circuit board 101, a first circuit board 102, and a second circuit board 103. The main circuit board 101 contains the main circuit boards, such as the rectifier circuit 111, the smoothing capacitor 112, inverter circuit 113, and power supply circuit 123 are mounted on the main circuit board 101, and the terminal block 114 to supply drive current to the motor. The first board 102 is mounted with a drive circuit 125 that detects the current of the inverter circuit 113 and outputs a drive signal to the inverter circuit 113. The second board 103 is mounted with a communication circuit 131 that is responsible for communication between the external device and the power conversion device.

The drive circuit 125 and the communication circuit 131 are reinforced and insulated from each other (dotted line area in the figure), and the insulating elements, photocouplers 121 and 122, which pass signals to each other through the insulating elements. The power supply circuit 123 receives the voltage Vdc1 at both ends of the smoothing capacitor 112 and supplies the power supply voltage Vdc2 to the drive circuit 125 and the power supply voltage Vdc3 to the communication circuit 131.

FIG. 18 shows a circuit diagram of a flyback converter commonly used as a power circuit 123. As shown in FIG. 18, the power circuit 123 comprises of an isolation transformer 124, rectifier diodes 201, 202, smoothing capacitors 203 and 204, MOSFET 205. In the isolation transformer 124, a voltage Vdc1 is connected to one terminal of the primary winding 1241, and the drain terminal of MOSFET 205 is connected to the other terminal. Pulse voltage is input to the primary winding 1241 of the isolation transformer 124 by switching MOSFET 205, and voltage corresponding to the turn ratio of the isolation transformer 124 is output from the secondary windings 1242 and 1243. The power is converted to voltage by the voltage conversion circuit as needed and consumed by loads such as drive circuit 125 and communication circuit 131. The primary windings 1241 and the secondary windings 1242 located in the high-power section and the secondary windings 1243 located in the low-power section are reinforced and insulated from each other.

In the power conversion device described in Patent Document 1, the photocouplers 121 and 122 are mounted on the first board 102, while the power circuit 123 is mounted on the main circuit board 101, so the reinforced insulation boundary is placed across the main circuit board 101 and first board 102, as shown in FIG. 17. Therefore, it is necessary to arrange the reinforced insulation boundary in a complex manner, which leads to larger circuit boards.

Example 1

Figure 1:
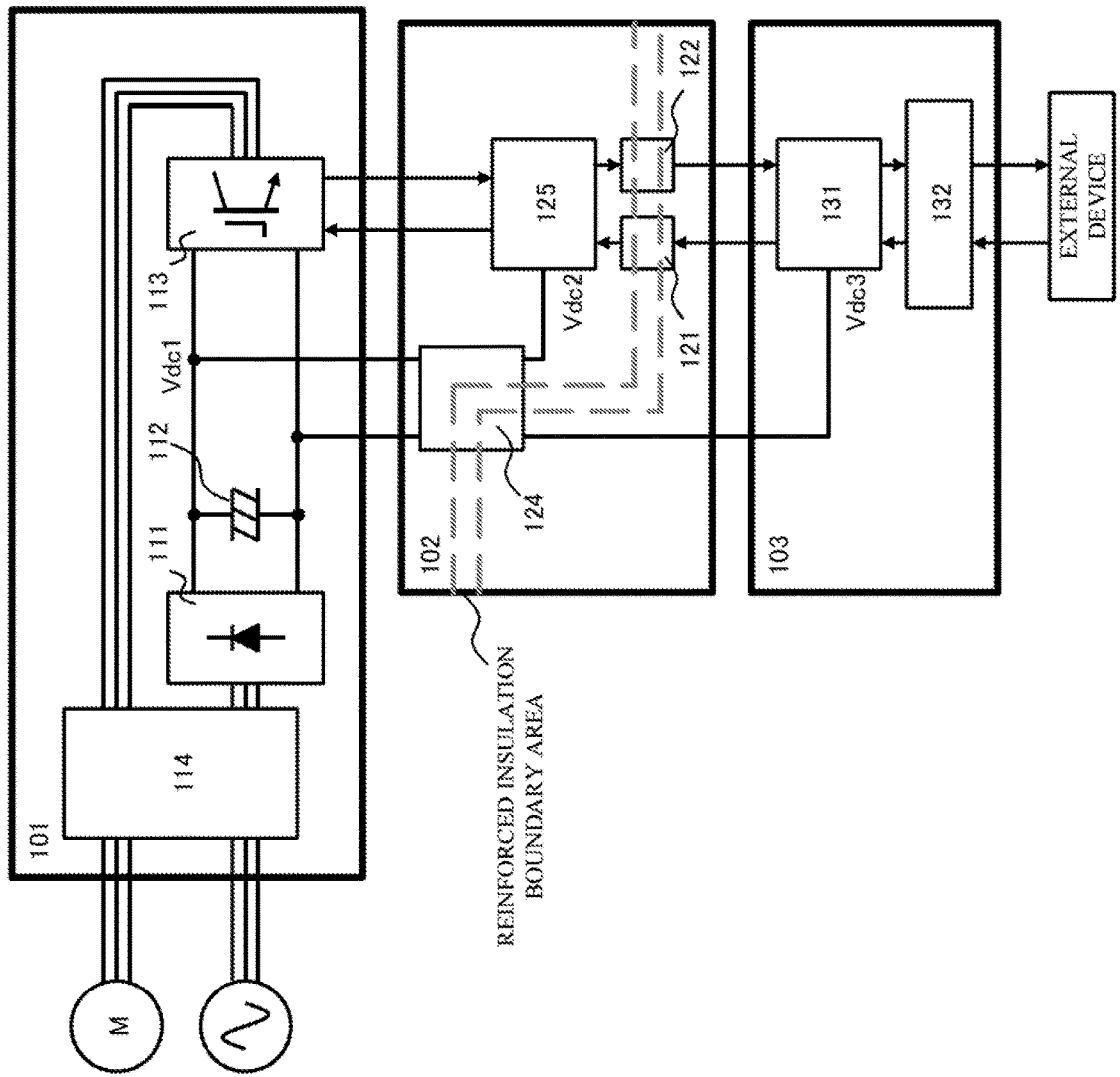
FIG. 1 is a block diagram of the power conversion device in Example 1.

FIG. 1 is a block diagram of the power conversion device in Example 1. As shown in FIG. 1, the power conversion device described in Example 1 comprises of three pieces: main circuit board 101, first board 102, and a second board 103. The main circuit board 101 comprises of three main circuit boards, including a rectifier circuit 111, a smoothing capacitor 112, and inverter circuit 113 are mounted on the main circuit board 101. In other words, the main circuit components are located in the high-power section. The first board 102 is mounted with a drive circuit 125 that outputs drive signals to the inverter circuit 113 and an isolation transformer 124 that is a component of the power circuit 123. Details of the power circuit 123 are described in FIG. 18, and an isolation transformer 124 is a component of the power circuit 123. The second board 103 is mounted with a communication circuit 131 that is responsible for communication between the external device and the drive circuit. In other words, the communication circuit 131 is placed in the lowly insulated area. The first board 102 has a reinforced insulation area (dotted line area in FIG. 1), and in this reinforced insulation area, the components of the power circuit that receives DC voltage and supplies power to various loads are mounted. The reinforced insulated area is used to receive signals between the isolation transformer 124, which is a component, the drive circuit 125, and the communication circuit 131. And photocouplers 121 and 122, which are insulating elements that transfer signals between the drive circuit 125 and the communication circuit 131. The reinforced isolation area is formed on the first board 102 by taking the high power section and the low power section at a predetermined distance defined by each standard.

This completes the reinforced insulation within the first board 102, since the insulating elements for configuring the reinforced insulation, the isolation transformer 124 and the photocouplers 121 and 122, are all mounted on the same board.

It is desirable for either the drive circuit 125 or the communication circuit 131 to include a microcontroller. For example, a microcontroller should be mounted in drive circuit 125, communication signals with external devices should be processed by communication circuit 131, and photocouplers 121, 122, and communicate with the microcontroller mounted in the drive circuit 125 via the photocouplers. The microcontroller mounted in the drive circuit 125 may communicate with the microcontroller mounted in the drive circuit 125 via photocouplers 121 and 122. A microcontroller can be mounted in the communication circuit 131, and after the current of the inverter circuit is calculated by the drive circuit 125, it can be transmitted to the microcontroller mounted in the communication circuit 131 via photocouplers 121 and 122, and the microcontroller can output drive signals to the inverter circuit via photocouplers 121 and 122. As in Patent Document 1, a microcontroller may be implemented in both the drive circuit 125 and the communication circuit 131.

Figure 2:
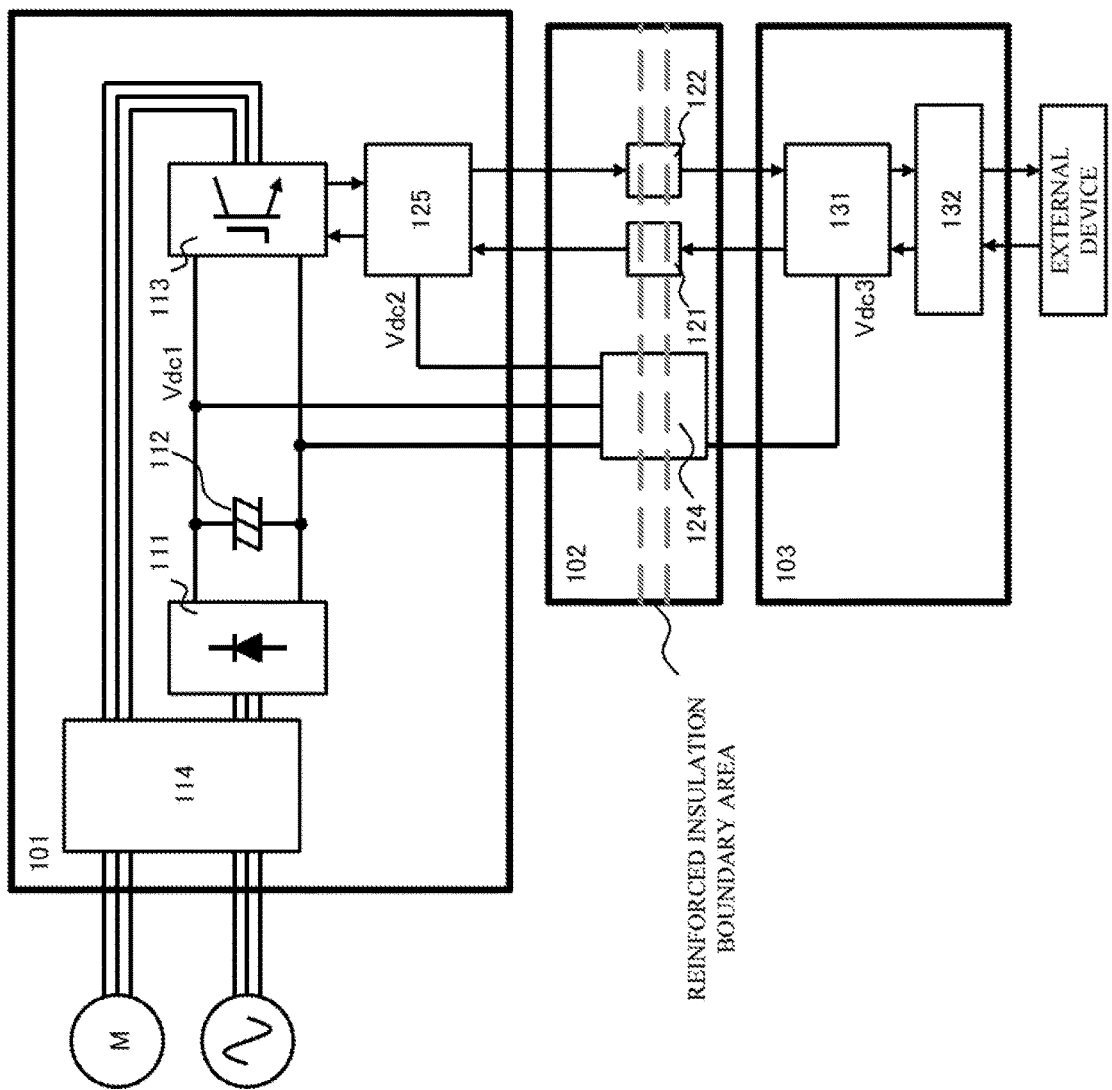
FIG. 2 is a block diagram of another power conversion device in Example 1.
Figure 3:
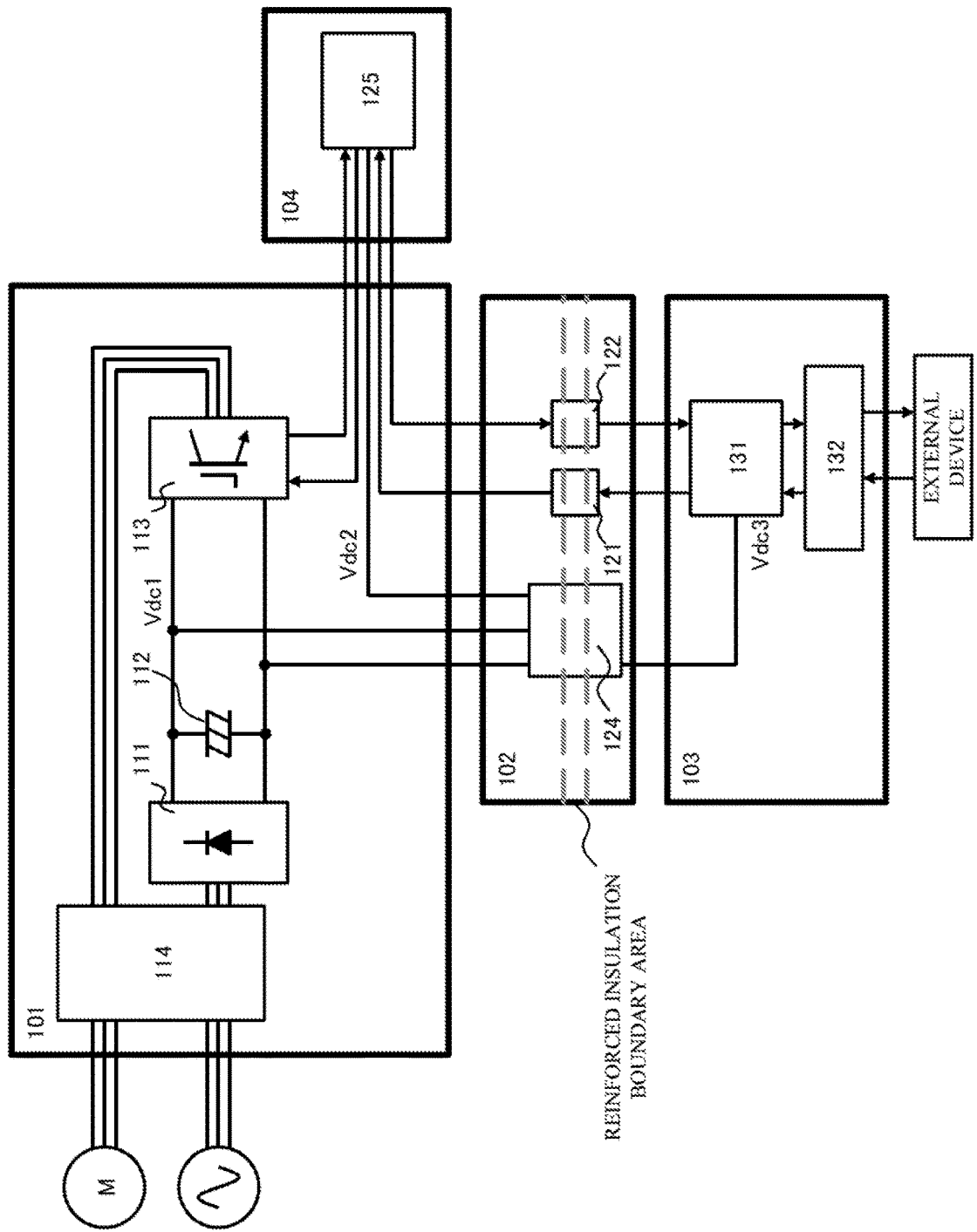
FIG. 3 is a block diagram of other power conversion devices in Example 1.

In addition, if the features of Example 1, namely the isolation transformer 124 and photocouplers 121 and 122 are provided on the first board, the drive circuit 125 can be mounted anywhere in the high-power section, not only on the first board 102. For example, as shown in FIG. 2, it can be mounted on the main circuit board 101, and as shown in FIG. 3, the communication circuit 131, which is not shown in the figure, is similarly not limited to the second board 103, but can be mounted anywhere in the low-power section.

As described above, according to Example 1, the isolation transformer 124, photocouplers 121, 122 are all mounted on the same board, reinforced insulation is completed within the first board 102, and the board can be downsized. Therefore, the reinforced insulation is completed in the first board 102, and the board can be downsized.

Example 2

Next, Example 2 is described. The basic board configuration is the same as in Example 1 described in FIG. 1 to FIG. 3. In this example, specific examples of the connection between the main circuit board 101 and the first board 102 are described using FIG. 4 through FIG. 7.

Figure 4:
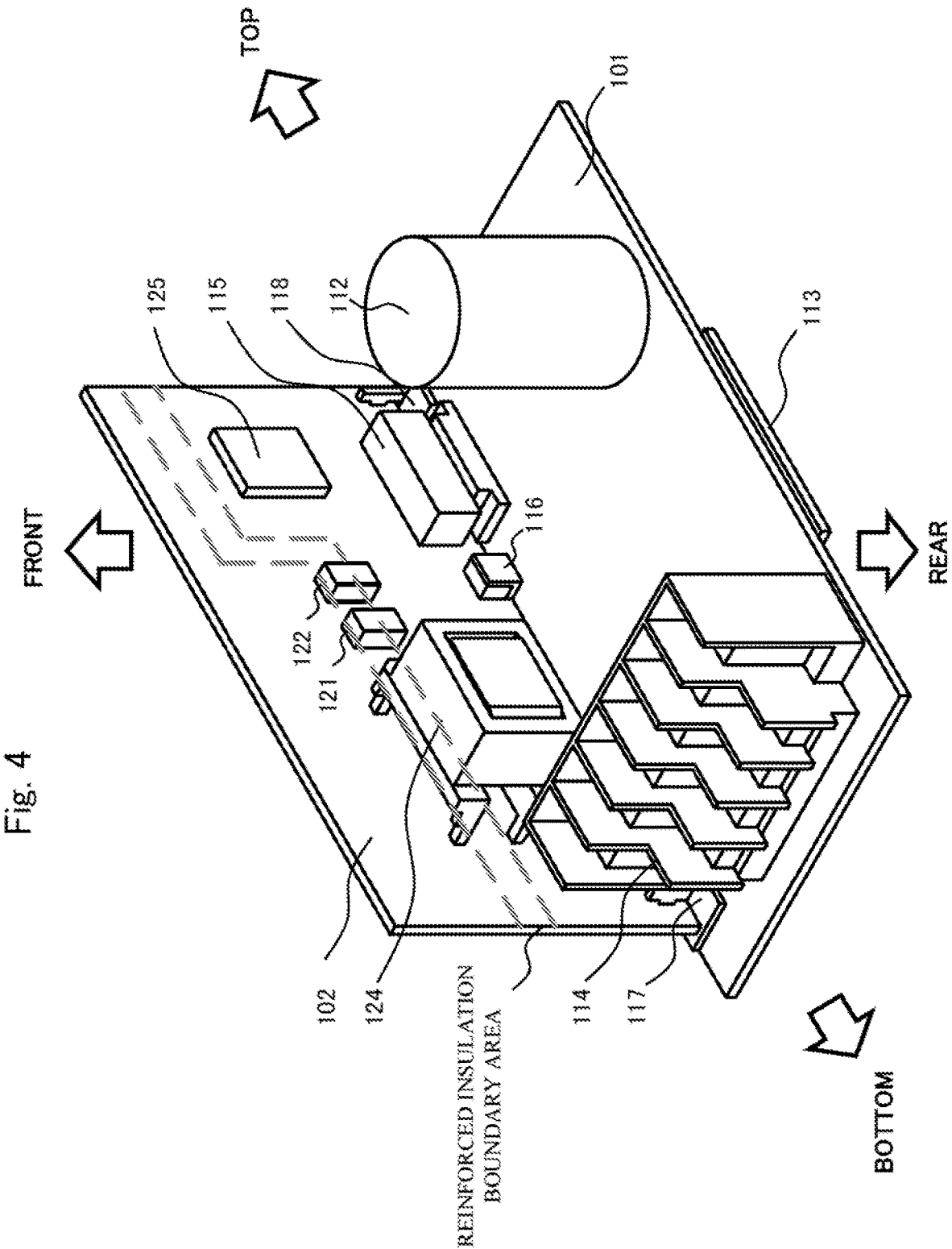
FIG. 4 is a diagram of the power conversion device in Example 1.
Figure 5:
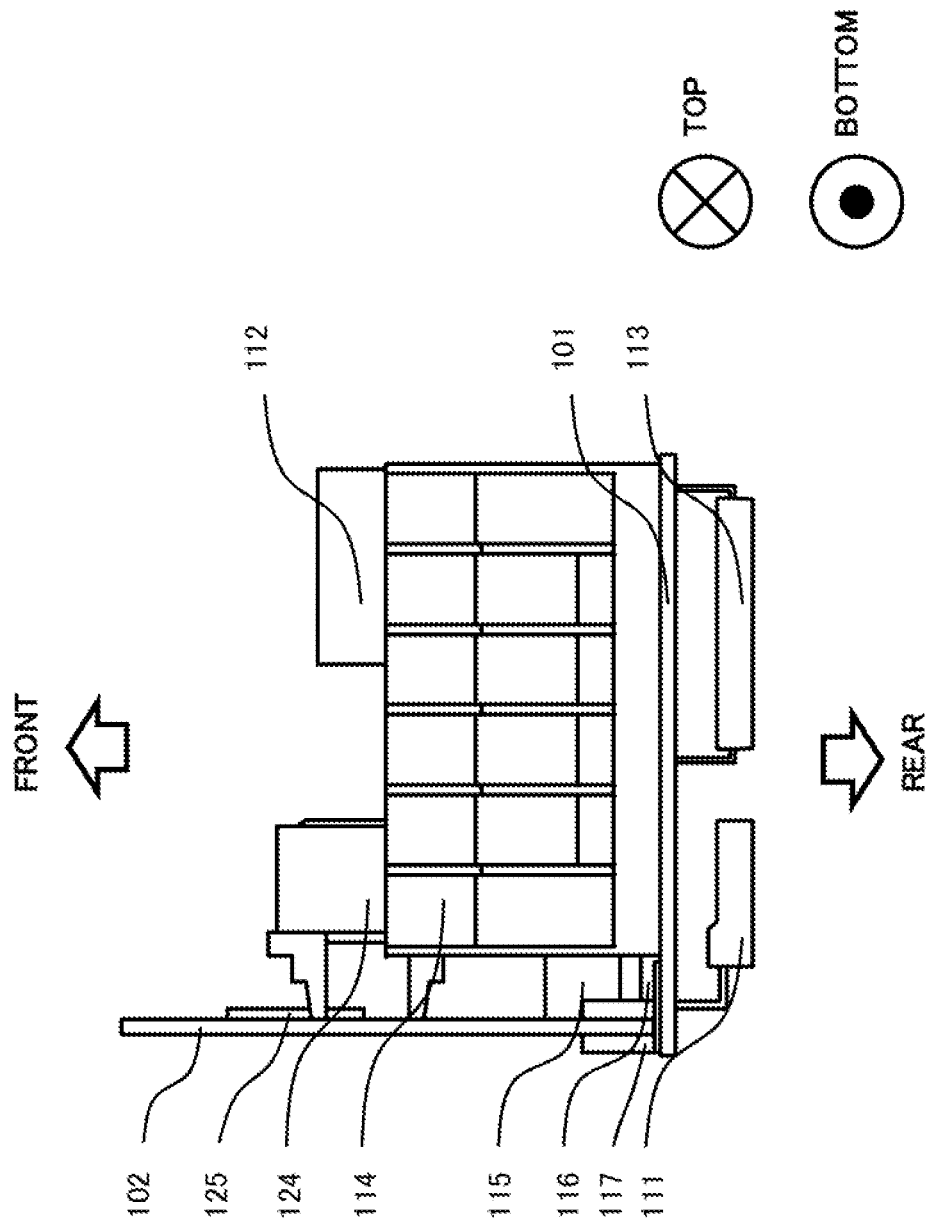
FIG. 5 is a bottom view of the power conversion device in Example 1.
Figure 13:
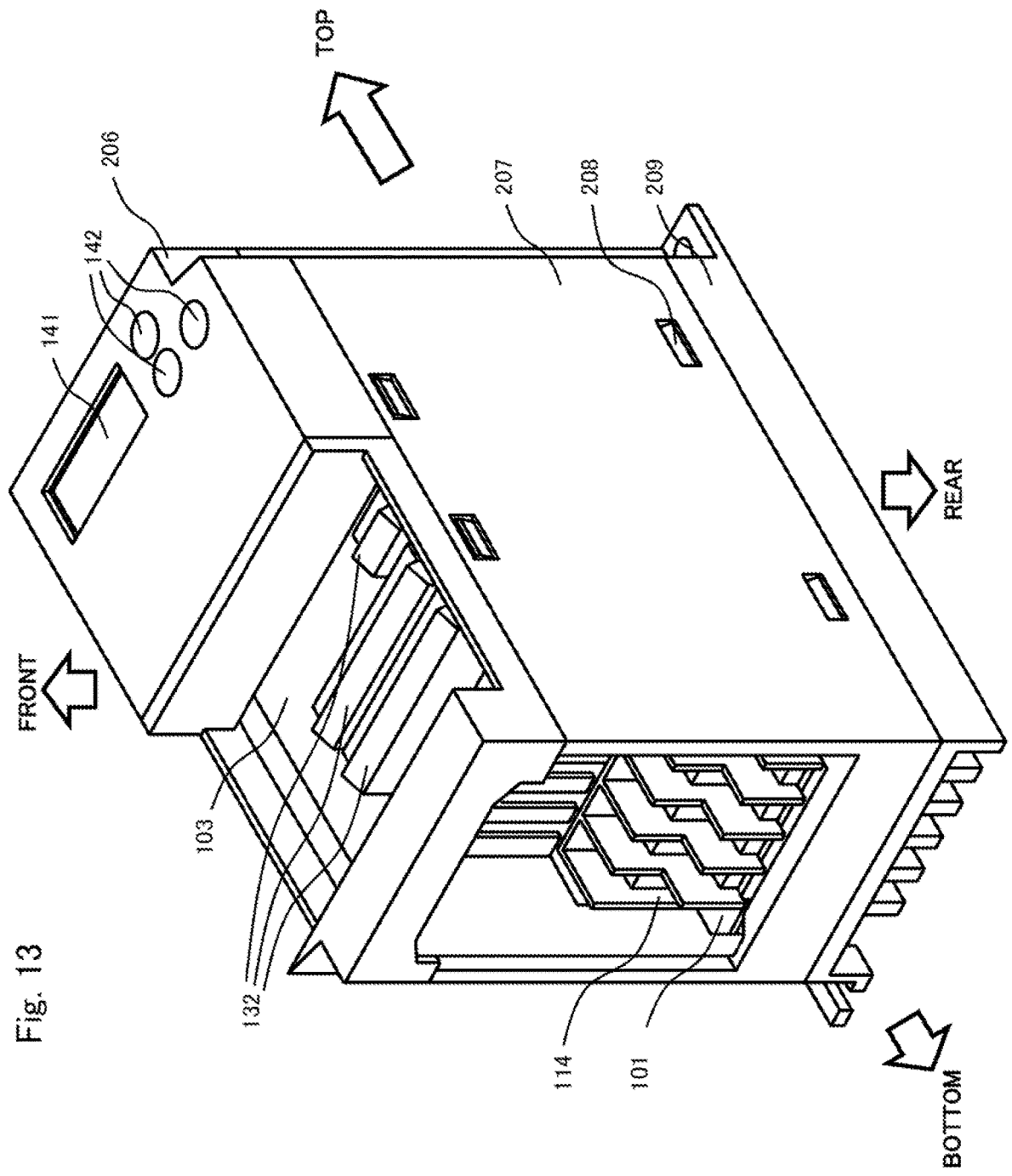
FIG. 13 is a diagonal view of the power conversion device.

FIG. 4 and FIG. 5 show the basic configuration of the power conversion device in this example. FIG. 4 is a diagonal view and FIG. 5 is a bottom view in the board configuration shown in FIG. 1. As in Example 1, the main circuit board 101 mainly performs the power conversion function of receiving system voltage and outputting AC power for motor drive, receiving system voltage at the terminal block 114 on the main circuit board 101 and outputting AC power to the motor from the terminal block 114 through the rectifier circuit 111 (see FIG. 5), smoothing capacitor 112 and inverter circuit 113. The terminal block 114 and smoothing capacitor 112 are located on the front side of the power conversion device on the main circuit board 101 (forward in FIG. 4). A diagram of the power conversion device is shown in FIG. 13, where the display panel with display 141 or operation units 142 is the front of the power conversion device. The rectifier circuit 111 and inverter circuit 113 are located on the rear side of the power conversion device and are joined to the heat dissipation fins described below. The first board 102 contains the drive circuit 125, photocouplers 121, 122, and the components of the power circuit 123, an isolation transformer 124 are mounted.

In the power conversion device described in this example, the main circuit board 101 and the first board 102 are erected generally vertically. The first board 102 is mounted on the opposite side of the main circuit board 101 from the side on which the rectifier circuit 111 and inverter circuit 113 are mounted. In other words, the first board 102 is mounted on the product side of the main circuit board 101 so as to secure a space on the front side of the power conversion device where the rectifier circuit 111 and inverter circuit 113 are mounted. The first board 102 is positioned so that it faces the side of the terminal block 114 of the main circuit board 101. This allows airflow by natural convection to be secured in the space on the front side of the product on the main circuit board 101, compared to the case where the first board 102 is mounted parallel to the main circuit board 101 so that the cooling performance of the rectifier circuit 111 and inverter circuit 113 can be secured.

The isolation transformer 124 is located on the inside side of the power conversion device on the first board 102 and is cooled by the previously mentioned natural convection. If the mounting area of the first board 102 is to be enlarged, the first board 102 may also be provided at a location facing the side of the terminal block 114.

In addition, between the main circuit board 101 and the first board 102, the smoothing capacitor 112 voltage Vdc1 (several hundred V) and the drive circuit 125 to the inverter circuit 113 (about several V), and drive signals, etc. (about several V) output from the drive circuit 113 must be transmitted simultaneously. If these wirings are in close proximity, there is concern about circuit malfunction due to noise superimposed on the low-voltage lines. For this reason, as shown in FIG. 4, a connector 115 for low-voltage transmission and a connector 116 for high-voltage transmission should be provided. As a connector, multiple connectors may be arranged according to the type of signal.

In FIG. 4 and FIG. 5, the main circuit board 101 and the first board 102 are connected by board-to-board connectors (115, 116). As a result, the power conversion device can be configured by inserting the first board 102 into the main circuit board 101 from the front side of the power conversion device. This allows the power conversion device to be configured by inserting the first board 102 from the front side of the power conversion device into the main circuit board 101, which eliminates the soldering process and allows for easy assembly. However, as long as the main circuit board 101 and the first board 102 are electrically connected, any configuration is possible. For example, a pin header can be used for soldering, or the main circuit board 101 and the first board 102 can be connected directly by soldering. The main circuit board 101 and the first board 102 may be connected directly by soldering.

As shown in FIG. 4 and FIG. 5, the first board 102 is physically connected to the main circuit board 101 with board-to-board connectors 115 and 116, but for further earthquake resistance, board-to-board fixation sections 117 and 118 may be provided. Specifically, the board-to-board fixing sections 117 and 118 are fixed to the main circuit board 101 by screwing or soldering, and are fixed in contact with the first board 102 by soldering or by clipping the board between the clips provided on the board-to-board fixing sections 117 and 118, or by other methods.

Figure 6:
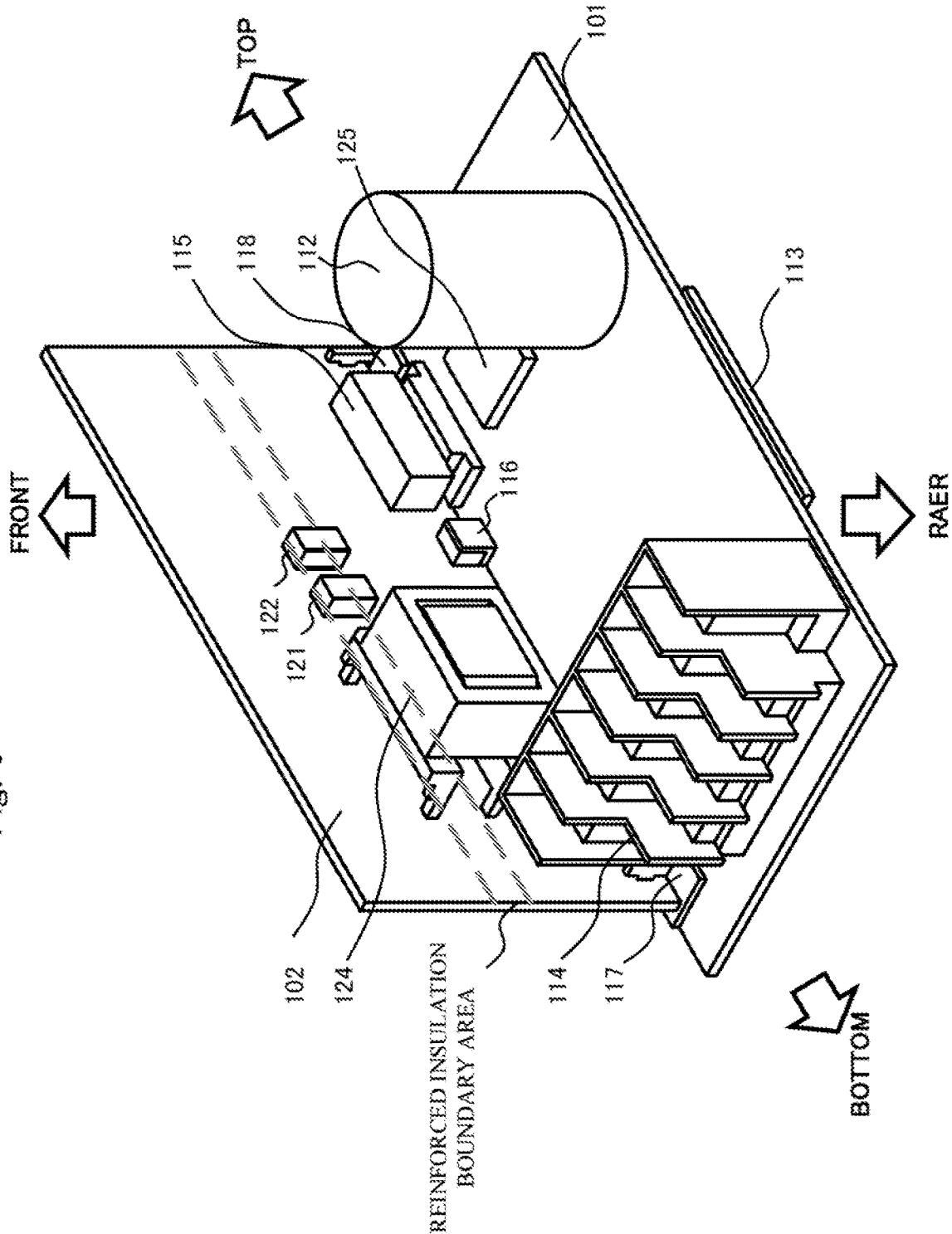
FIG. 6 is a diagram of the power conversion device in Example 2.
Figure 7:
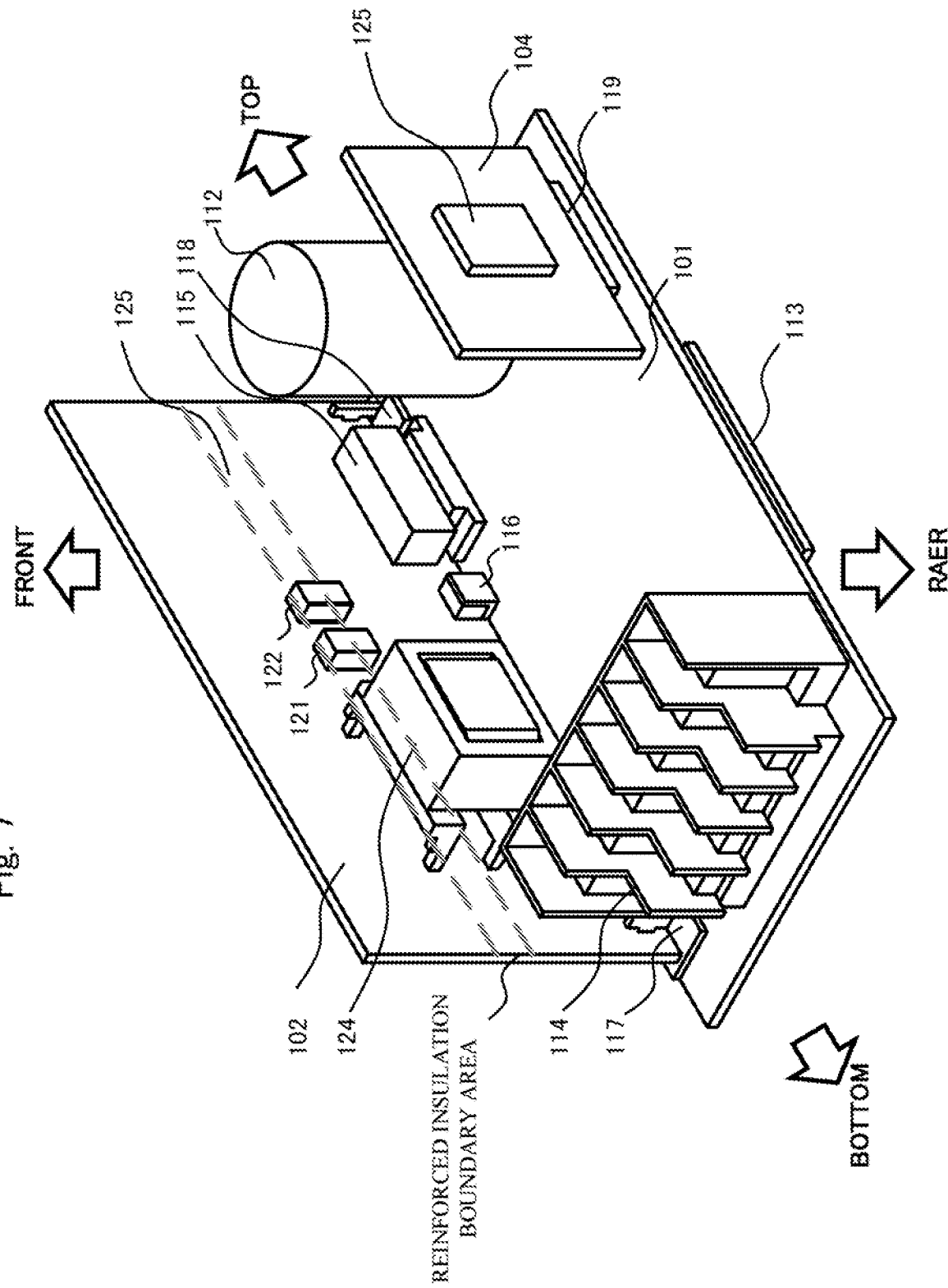
FIG. 7 is a diagram of another power conversion device in Example 2.

FIG. 6 and FIG. 7 show the basic configuration of the power conversion device in Example 2. FIG. 6 is a diagrammatic view of the board configuration shown in FIG. 2, and FIG. 7 is a diagrammatic view of the board configuration shown in FIG. 3. As shown in FIG. 6, in the board configuration shown in FIG. 2, as in the configurations shown in FIG. 4 and FIG. 5, the first board 102 is erected against the main circuit board 101, and the drive circuit 125 is mounted on the main circuit board 101. The drive circuit 125 is mounted on the main circuit board 101. As shown in FIG. 7, in the board configuration shown in FIG. 3, as in the configurations shown in FIG. 4 to FIG. 6, the first board 102 is erected against the main circuit board 101, and furthermore, the third circuit board 104 is mounted on the board-to-board connector 119. Board connector 119 allows the third board 104 to be erected against the main circuit board 101. This allows the drive circuit 125 to be mounted in the high-power section without reducing the space for airflow due to natural convection on the front side of the product in the inverter circuit 113.

The board-to-board connector 119 can be made of any configuration as long as it is electrically connected, for example, it can be soldered using a pin header, or it can be directly soldered between the main circuit board 101 and the third board 104.

According to Example 2, the isolation transformer 124 and photocouplers 121 and 122, which are the isolation elements to constitute the reinforced insulation, are all mounted on the same board, so the reinforced insulation is completed in the first board 102, and the board can be made smaller.

According to Example 2, the first board 102 is connected perpendicularly to the main circuit board 101, which allows convection of heat from the rectifier circuit 111 and inverter circuit mounted on the main circuit board 101, thereby improving cooling efficiency. cooling efficiency can be improved.

Example 3

Next, Example 3 is described. The basic board configuration is the same as in Example 1 described in FIG. 1 to FIG. 3. In this example, specific examples of the connection between the first board 102 and the second board 103 are described using FIG. 8 and FIG. 9.

Figure 8:
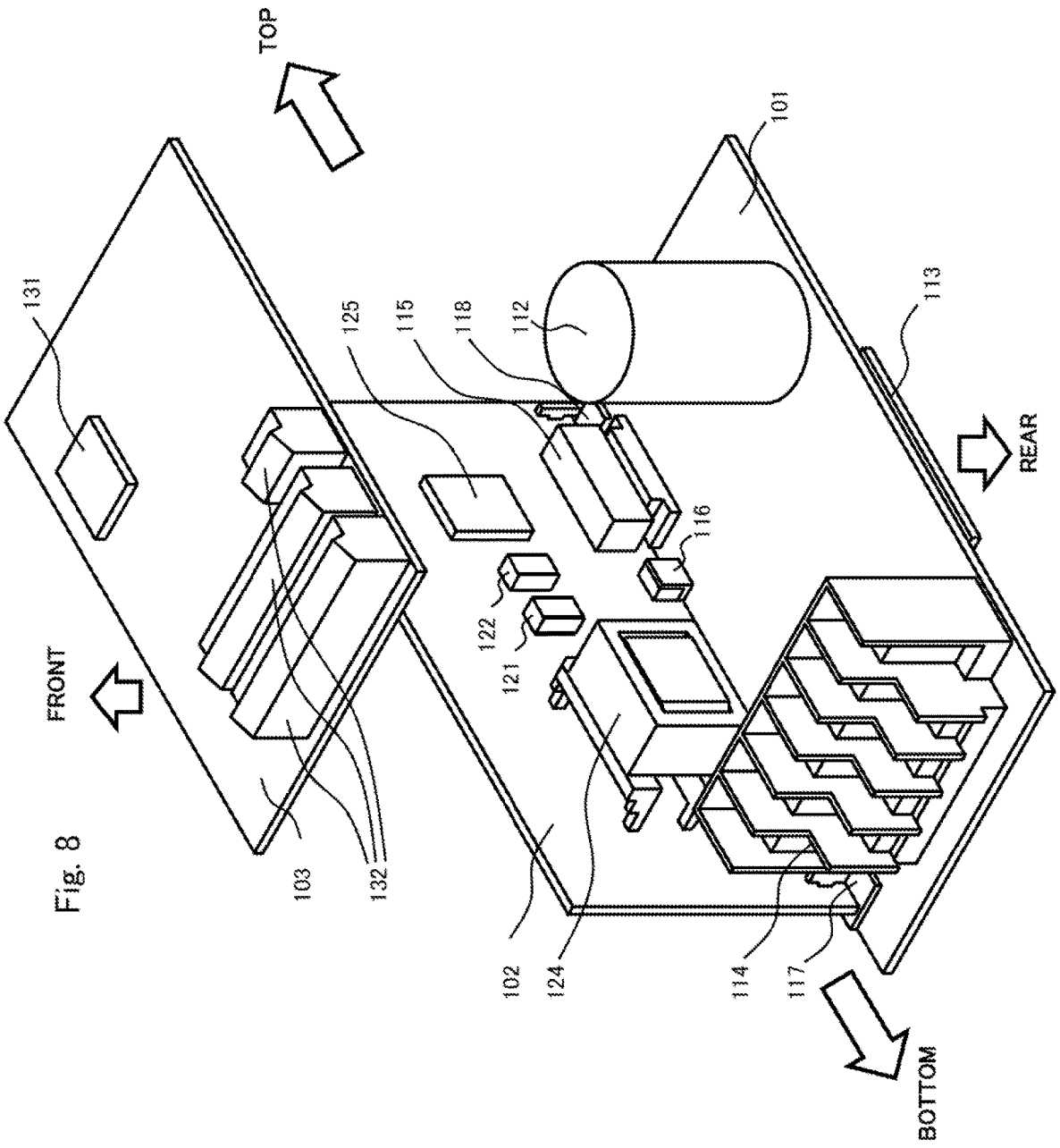
FIG. 8 is a diagram of the power conversion device in Example 3.
Figure 9:
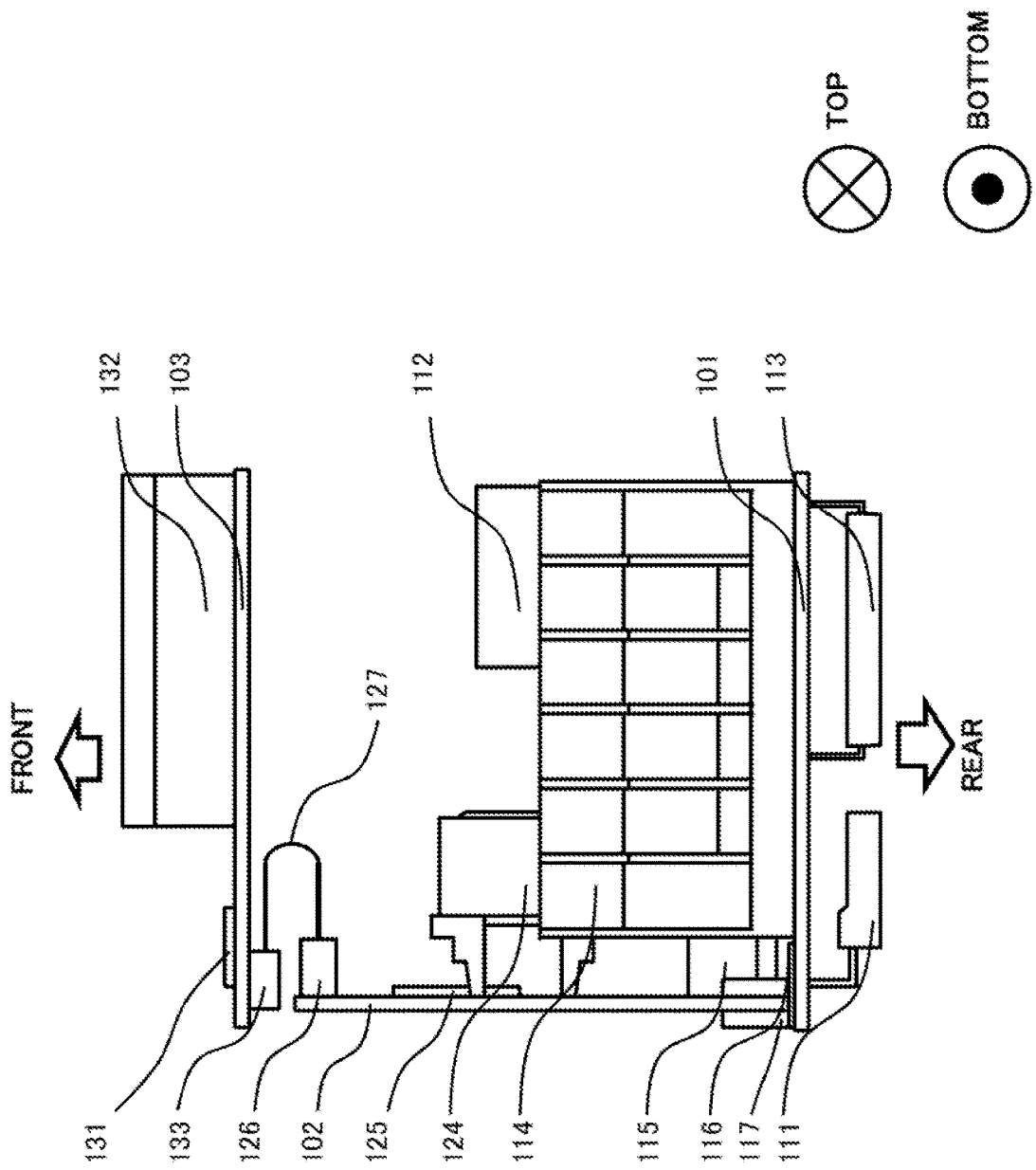
FIG. 9 is a bottom view of the power conversion device in Example 3.

FIG. 8 and FIG. 9 show the basic configuration of the power conversion device in Example 3. FIG. 8 is a diagonal view and FIG. 9 is a bottom view. As shown in FIG. 8 and FIG. 9, the power conversion device described in this example has the second board 103 positioned generally parallel to the main circuit board 101. The first board 102 is placed between the main circuit board 101 and the second board 103, and placed generally perpendicular to both the main circuit board 101 and the second board 103.

The second board 103 has a communication circuit 131, which is responsible for communication between the external device and the power conversion device, and a terminal block 132, which is the interface between the external device and the power conversion device. The user connects the external device and the terminal block 132 with wires to construct the desired communication system.

Here, since both the main circuit board 101 and the second board 103 are equipped with terminal blocks (114, 132), it is desirable that both boards be placed parallel to the front of the product (front of the power conversion device) for ease of operation by the user. In addition, since the first board 102 is responsible for signal transfer between the main circuit board 101 and the second board 103, the signal transmission means between the main circuit board 101 and the second board 103 can be simplified, making it possible to configure a compact power conversion device as a whole.

In addition, when the user connects the wires to the terminal block 132, an external force is applied from the front of the product toward the rear. If the main circuit board 101 and the first board 102 are fixed using the method described in Example 2, and the first board 102 and the second board 103 are fixed by soldering, pin headers, board-to-board connectors, etc., the external force is transmitted to the first board 102 and the main circuit board 101 via the second board 103, and there is concern that the connection between the boards may be damaged or the boards may be damaged.

Therefore, as shown in FIG. 9, signals between the first board 102 and the second board 103 are transmitted using board-to-cable connectors 126 and 133 and cable 127. As a result, external forces applied to the second board 103 do not affect the first board 102, making it possible to configure a power conversion device with superior durability compared to a case where the first board 102 and second board 103 are fixed between them.

Note that the connection between the first board 102 and the second board 103 does not need to use a cable if it is configured to escape external forces, for example, a board-to-board movable (floating) connector may be applied.

In addition, the board configuration shown in FIG. 1, the third board 103 based on main circuit board 101 and the first board shown in FIG. 4, however, even if the third board 104 is installed on the board configurations shown in FIGS. 2 and 3 and the basic configurations shown in FIGS. 5 and 6, the third substrate 104 can still be installed on the first substrate 102. Thereby the same effect can be obtained by placing the third substrate 104 generally perpendicular to the first substrate 102.

Example 4

Figure 10:
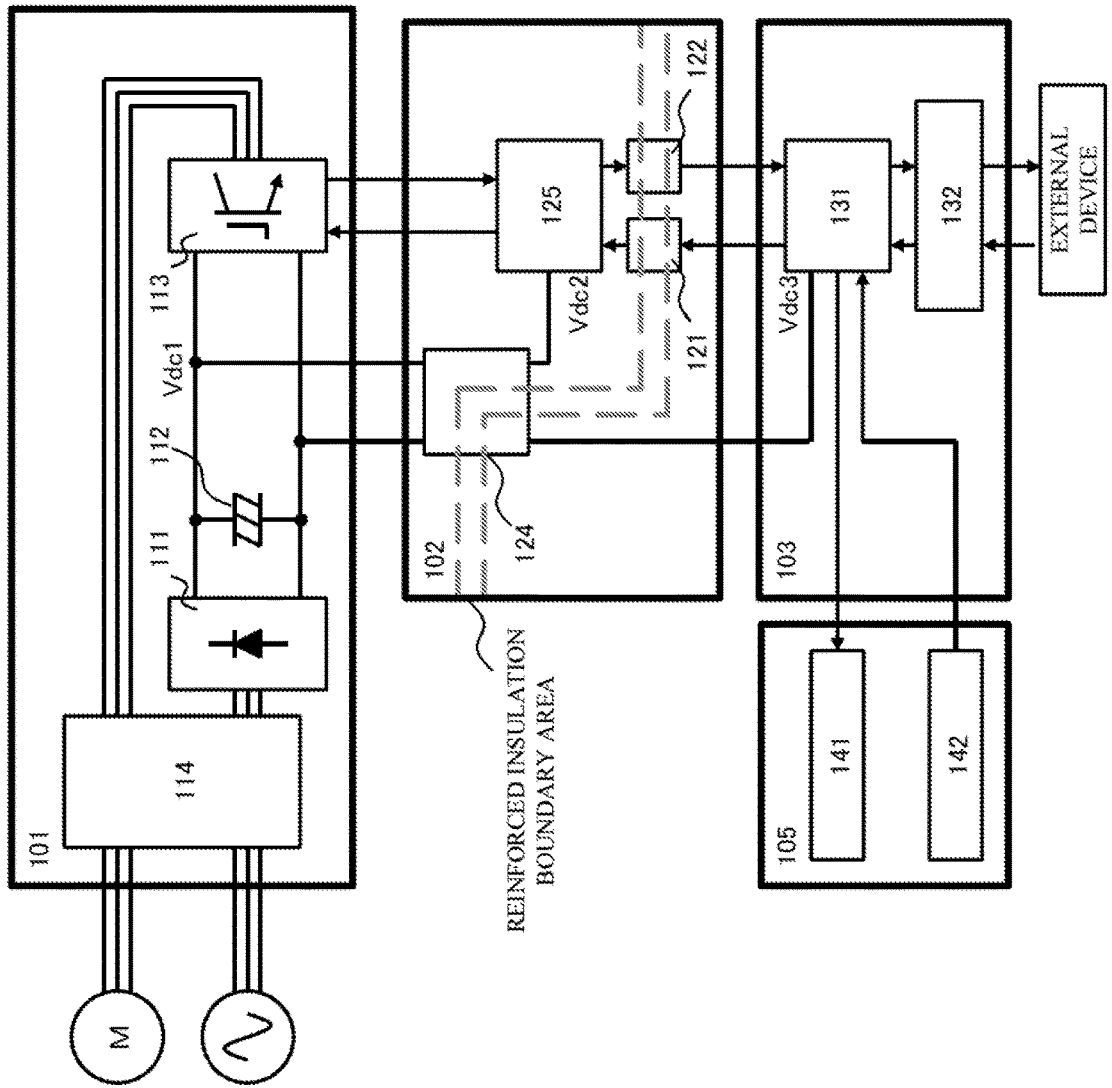
FIG. 10 is a block diagram of the power conversion device in Example 4.
Figure 11:
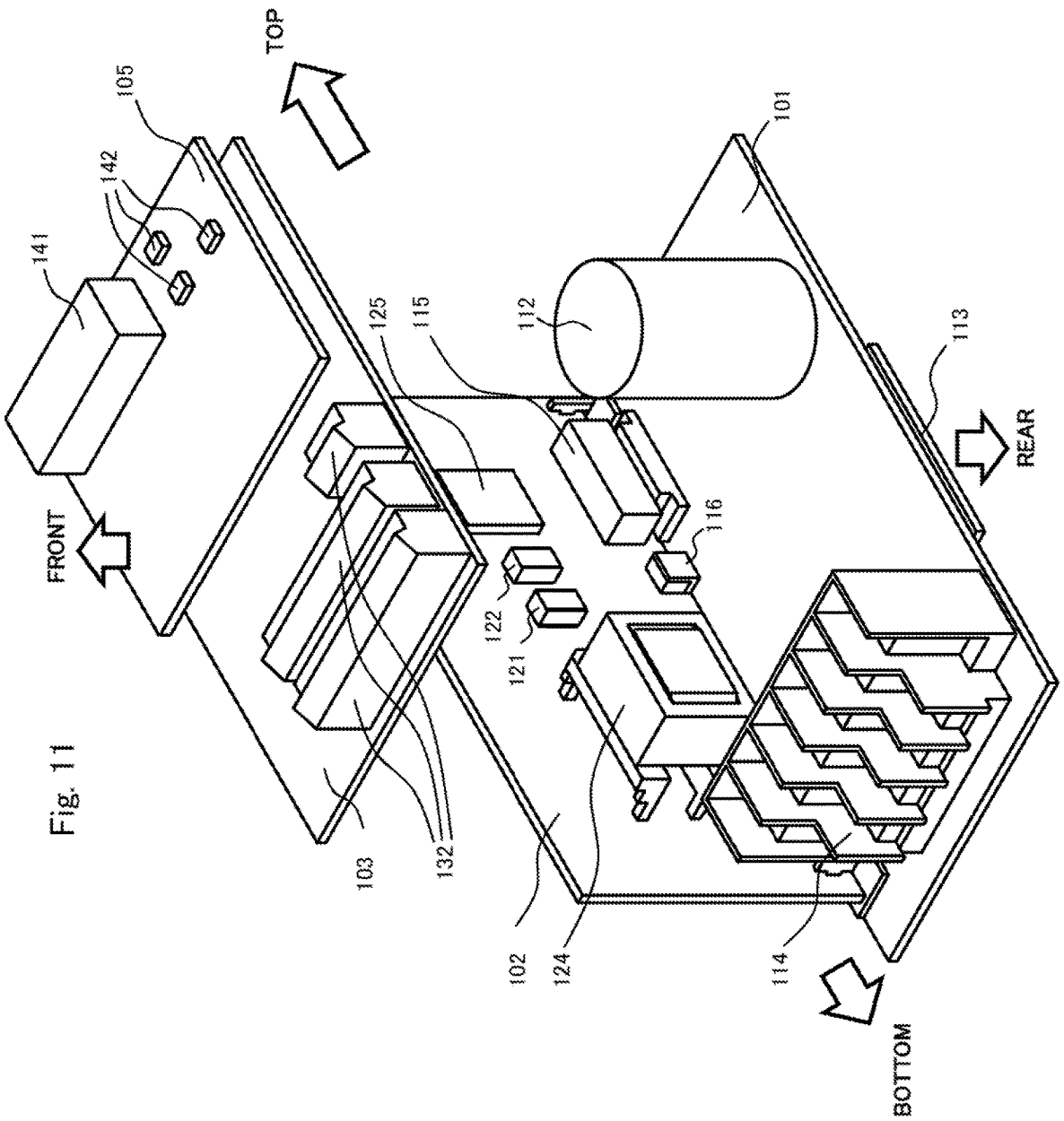
FIG. 11 is a diagram of the power conversion device with an additional fourth board.
Figure 12:
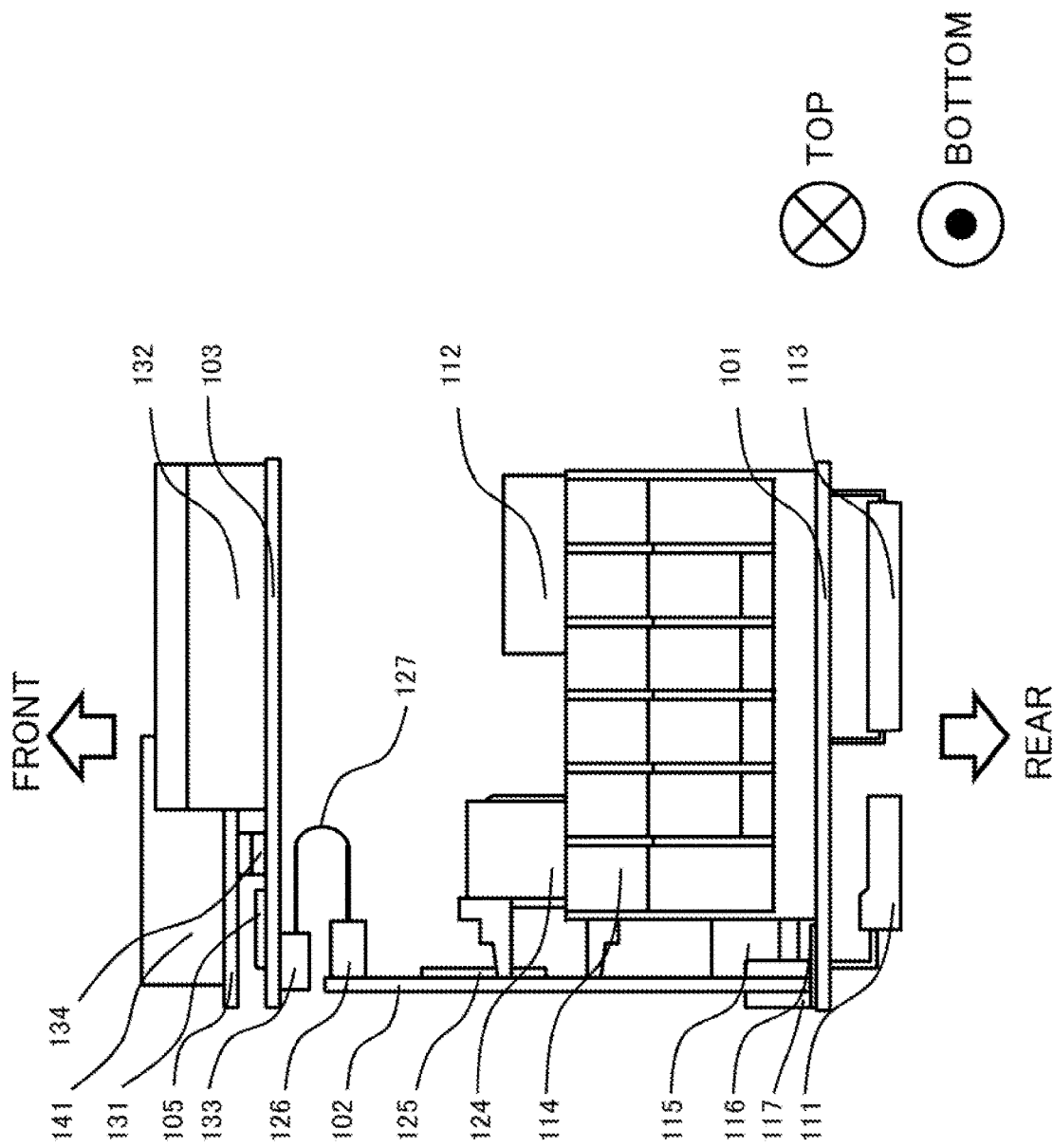
FIG. 12 is a bottom view of the power conversion device when a fourth board is added.

Next, Example 4 is described using FIG. 10 through FIG. 12.

FIG. 10 is a block diagram of the power conversion device in this example. In the power conversion device described in Example 4, in contrast to the power conversion device described in Examples 1 to 3, a fourth circuit board 105 with a display 141 or an operation unit 142 is added.

The display 141 comprises of a 7-segment LED that displays data such as frequency and setting values, and an operating lamp that lights up when the inverter is running. The operation unit 142 comprises of the RUN key to operate the inverter, the STOP key to decelerate/stop the inverter, and so on. The display section 141 and the operation unit 142 improve the workability of the user of the equipment.

FIG. 11 and FIG. 12 show the basic configuration of the power conversion device when a fourth board is added to the configuration shown in FIGS. 1, 4, 5, 8, and 9. FIG. 11 is a diagonal view and FIG. 12 is a bottom view. Considering the user's workability, it is desirable to place the display 141 and operation unit 142 parallel to the front of the product as well as the main circuit board 101 and the second board 103, so the fourth board 105 is generally connected to the second board 103 in parallel via board-to-board connector 134 as shown in FIG. 11 and FIG. 12.

Example 5

Next, Example 5 is described using FIG. 13 through FIG. 16.

FIG. 13 is a configuration diagram of the power conversion device in Example 5. In the power conversion device described in this example, cases 206-208 and heat dissipating fins 209 that protect each of the boards 101-105 are added to the power conversion device described in Example 4.

Figure 14:
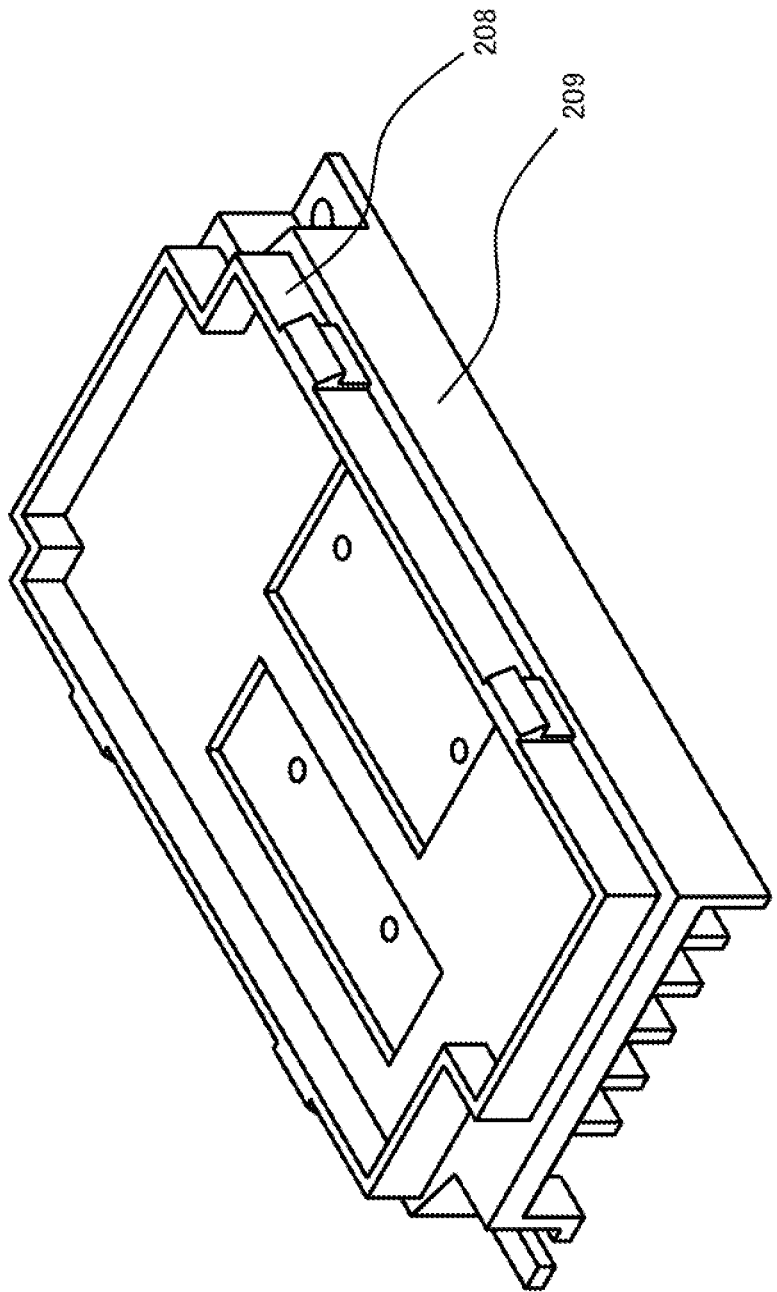
FIG. 14 shows the heat radiation fins and the module case.

FIG. 14 depicts the heat dissipating fins 209 and module case 208 from FIG. 13. The heat-dissipating fins 209 are arranged for the purpose of dissipating heat generated from the rectifier circuit 111 and inverter circuit 113 mounted on the main circuit board 101. In addition, the module case 208 has an opening in the part where the rectifier circuit 111 and inverter circuit 113 are mounted in advance and is fixed to the heat radiation fin 209 so that the mounting position can be easily determined when the rectifier circuit 111 and inverter circuit 113 are mounted on the heat radiation fin 209.

Here, when the module case 208-heat dissipating fin 209 is fixed with screws, it is also possible to co-tighten with other components with the screws. For example, in the case of fastening the board-to-board fixing sections 117 and 118 and the first board as described in Example 2 with screws, the number of screws can be reduced by using the same screws to fasten the board-to-board fixing sections 117 and 118, the first board 102, the module case 208, and the heat radiation fin 209.

Although not shown in FIG. 13 and FIG. 14, a cooling fan may be added to the fins 209 to further improve the heat dissipation performance of the power conversion device.

Figure 15:
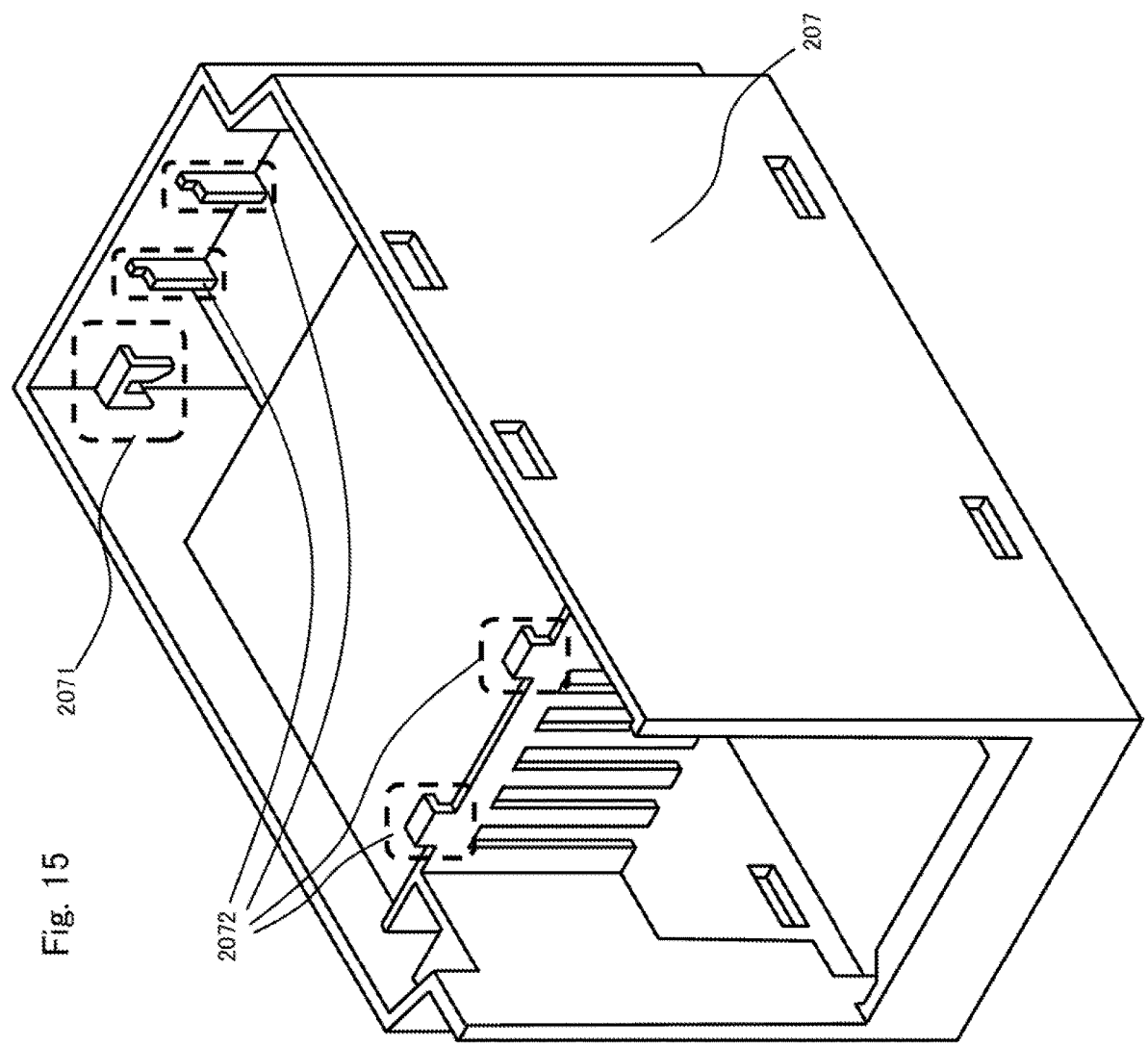
FIG. 15 shows the main body case.

FIG. 15 shows the main body case 207 extracted from FIG. 13. The main body case 207 protects each of the boards 101-103 from the outside and is configured to be joined with the module case 208 or the heat dissipation fins 209.

As mentioned earlier, the first board 102 is fixed to the main circuit board 101 by board-to-board connectors 115 and 116 or board-to-board fixation sections 117 and 118. To further reinforce earthquake resistance, the main case 207 may be provided with a 2071 fixing section for fixing the first board 102. Specifically, the first board 102 is secured to the main case 207 by contacting it, such as by screwing it to the main case 207 or by pinching it into the gap provided in the fixing section 2071. The second board 103 is fixed to the main case 207 by screwing or by pinching it into the gap provided in the fixing section 2072.

Figure 16:
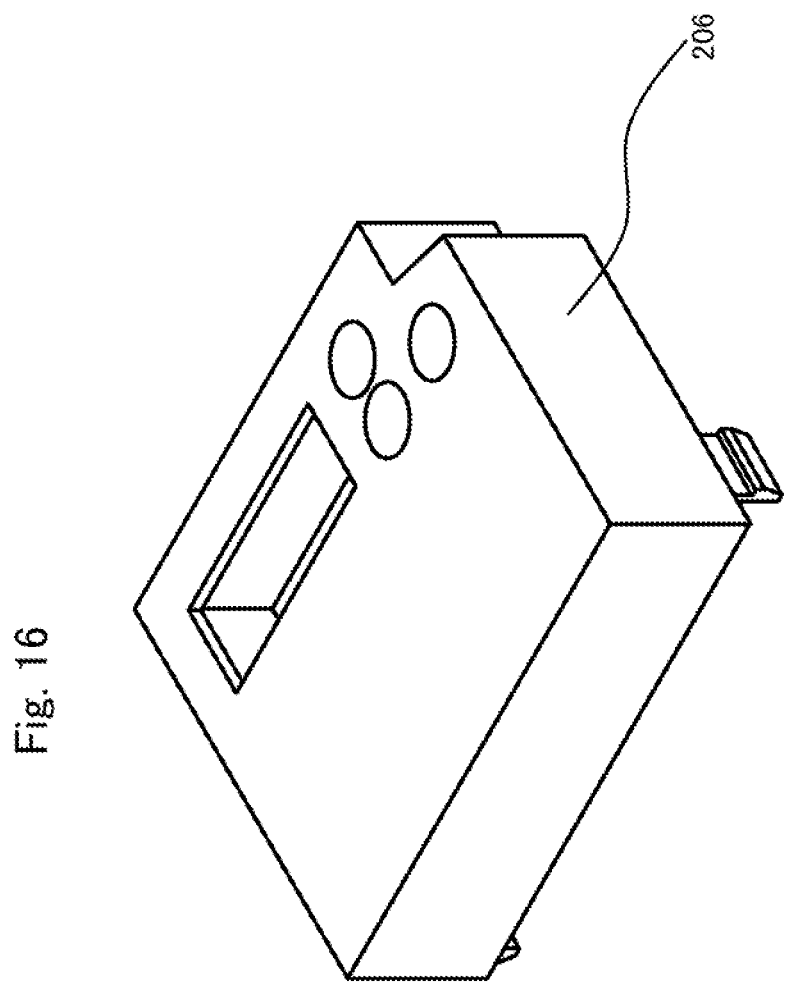
FIG. 16 shows the front cover.

FIG. 16 shows the front cover 206 extracted from FIG. 13. The front cover 206 protects the fourth board 105, the display 14 1, and operation unit 142 from the outside, and is configured to be joined to the main case 207. The fourth board 105 is fixed in contact with the front cover 206, and the front cover, when the 206 is joined to the main body cover 207, the connector 13 4 is configured to mate with it when the front cover 206 is joined to the main unit cover 207.

101, 102, 103, 104, 105: Board
111: Rectifier circuit
112: Smoothing capacitor
113: Inverter circuit
114, 132: Terminal block
115, 116, 119, 126, 133, 134: Board-to-board connections
117, 118: Board-to-board fixing section
121, 122: Photocouplers
123: Power supply circuit
124: Isolation transformer
1241: Primary winding
1242, 1243: Secondary winding
125: Drive circuit
127: Cable
131: Communication circuit
141: Display section
142: Operation unit
201, 202: Rectifier diodes
203, 204: Smoothing capacitor
206, 207, 208: Case
209: Heat dissipation fins
2071, 2072: fixing section in

What is claimed is:

1. A power conversion device, having a main circuit board (101), a first board (102), and a second board (103), comprising:
   a first circuit (125) located in a high-power section;
   wherein said main circuit board (101) has
   a rectifier circuit (111) that rectifies AC voltage and outputs DC voltage, and
   an inverter circuit (113) that inverts said DC voltage and outputs AC power, in said high-power section;
   wherein said second board (102) has a second circuit (131) located in a low-power section,
   wherein said first board (102) is connected to said main circuit board (101) and said second board (103),
   wherein said first board (102) has a reinforced insulation area for reinforcing and insulating said high-power section and said low-power section;
   an isolation transformer (124), which is located in said reinforced insulation area and is a component of a power supply circuit (123) that receives said DC voltage and supplies power to said first and second circuits, and
   an insulating element, disposed in said reinforced insulation area, transfers signals between said first circuit (125) and said second circuit (131),
   wherein said power conversion device further comprises heat dissipating fins for cooling the inverter circuit, and
   a module case fixed to said heat radiation fins and having an opening that matches the shape of the inverter circuit.

2. The power conversion device as claimed in claim 1, wherein said first circuit is mounted on said first board.

3. The power conversion device as claimed in claim 1, wherein said first circuit is a drive circuit (125) that outputs drive signals to said inverter circuit.

4. The power conversion device as claimed in claim 1, wherein said second circuit (131) is a communication circuit that transfers signals to and from an external device.

5. The power conversion device as claimed in claim 1, further comprising:
   a third board (104) connected to the main circuit board (101),
   said first circuit (125) is a drive circuit mounted on the third board that outputs drive signals to the inverter circuit.

6. The power conversion device as claimed in claim 1, wherein said first board (102) is erected on the main circuit board.

7. The power conversion device as claimed in claim 1, wherein said power conversion device further comprises,
   a first fixing means for contacting both said main circuit board and said first board and fixing said main circuit board and said first board,
   any three or more of said heat dissipating fins, said module case, said first fixing means, and the main circuit board are co-tightened with a same screw.

8. The power conversion device as claimed in claim 1, wherein said power conversion device further comprises, a body case configured to be joined to said module case, and wherein said main body case is equipped with a second fixing means for fixing the first board.

9. The power conversion device according to claim 1, wherein said power conversion device further comprises:
   a fourth board (105) connected horizontally to said second board,
   the third board is connected horizontally to the fourth board,
   a module case is fixed to said heat dissipation fins and has opening that matches the shape of the inverter circuit,
   a body case configured to be joined to the module case, and
   a front cover configured to be joined to the body case,
   wherein said front cover is equipped with a third fixing means for fixing the fourth board.

10. The power conversion device as claimed in claim 6, wherein said first board (102) is located on the side of the main circuit board opposite the side on which the inverter circuit (113) is mounted.

11. The power conversion device as claimed in claim 6, further comprising a first fixing means for contacting both said main circuit board and said first board and fixing said main circuit board and said first board.

12. A power conversion device, having a main circuit board, a first board, and a second board, comprising:
   a first circuit located in a high-power section;
   wherein said main circuit board has
   a rectifier circuit that rectifies AC voltage and outputs DC voltage, and an inverter circuit that inverts said DC voltage and outputs AC power, in said high-power section;
wherein said second board has a second circuit located in a low-power section,
wherein said first board is connected to said main circuit board and said second board,
wherein said first board has a reinforced insulation area for reinforcing and insulating said high-power section and said low-power section;
an isolation transformer, which is located in said reinforced insulation area and is a component of a power supply circuit that receives said DC voltage and supplies power to said first and second circuits, and
an insulating element, disposed in said reinforced insulation area, transfers signals between said first circuit and said second circuit;
wherein said first board (102) is erected on the main circuit board,
wherein said main circuit board is equipped with a terminal block to receive the AC voltage, and
wherein said first board faces the side of said terminal block.

13. A power conversion device, having a main circuit board, a first board, and a second board, comprising:
a first circuit located in a high-power section;
wherein said main circuit board has
a rectifier circuit that rectifies AC voltage and outputs DC voltage, and
an inverter circuit that inverts said DC voltage and outputs AC power, in said high-power section;
wherein said second board has a second circuit located in a low-power section,
wherein said first board is connected to said main circuit board and said second board,
wherein said first board has a reinforced insulation area for reinforcing and insulating said high-power section and said low-power section;
an isolation transformer, which is located in said reinforced insulation area and is a component of a power supply circuit that receives said DC voltage and supplies power to said first and second circuits, and
an insulating element, disposed in said reinforced insulation area, transfers signals between said first circuit and said second circuit;
wherein said first and second boards are arranged vertically, and the second board faces the main circuit board.

14. The power conversion device as claimed in claim 13, wherein said power conversion device further comprises a fourth board connected horizontally to said second board, said fourth board comprising at least one of an operation unit for operating the inverter circuit and or a display unit for outputting the operating status of the inverter circuit.

* * * * *